United States Patent
Aina et al.

(10) Patent No.: US 9,780,743 B2
(45) Date of Patent: Oct. 3, 2017

(54) LIGHT SENSOR READOUT SYSTEM AND METHOD OF CONVERTING LIGHT INTO ELECTRICAL SIGNALS

(71) Applicant: Google Inc., Mountain View, CA (US)

(72) Inventors: Morakinyo John Aina, San Jose, CA (US); Lawrence Heyl, Colchester, VT (US)

(73) Assignee: Google Inc., Mountain View, CA (US)

( * ) Notice: Subject to any disclaimer, the term of this patent is extended or adjusted under 35 U.S.C. 154(b) by 167 days.

(21) Appl. No.: 14/919,940

(22) Filed: Oct. 22, 2015

(65) Prior Publication Data

US 2017/0117859 A1    Apr. 27, 2017

(51) Int. Cl.
| | | |
|---|---|---|
| H03F 3/45 | (2006.01) | |
| H03F 3/68 | (2006.01) | |
| H03F 1/26 | (2006.01) | |
| H03F 1/56 | (2006.01) | |
| H03F 3/08 | (2006.01) | |

(52) U.S. Cl.
CPC ............ *H03F 3/45* (2013.01); *H03F 1/26* (2013.01); *H03F 1/56* (2013.01); *H03F 3/08* (2013.01); *H03F 3/68* (2013.01); *H03F 2200/171* (2013.01); *H03F 2203/45078* (2013.01)

(58) Field of Classification Search
CPC .......... H03F 3/45475; H03F 1/56; H03F 3/45; H03F 3/68; H03F 1/26; H01S 5/0683
USPC ...................................................... 250/214 R
See application file for complete search history.

(56) References Cited

U.S. PATENT DOCUMENTS

| | | |
|---|---|---|
| 3,742,474 A | 6/1973 | Muller |
| 4,029,976 A | 6/1977 | Fish et al. |
| 4,352,982 A | 10/1982 | Forward et al. |
| 4,426,662 A | 1/1984 | Skerlos et al. |
| 4,535,233 A | 8/1985 | Abraham et al. |
| 4,959,535 A | 9/1990 | Garrett |
| 5,010,588 A | 4/1991 | Gimlett |
| 5,084,639 A | 1/1992 | Ribner |
| 5,111,324 A | 5/1992 | Jahromi |
| 5,521,555 A | 5/1996 | Tazartes et al. |
| 5,565,672 A | 10/1996 | Siegel et al. |
| 5,661,435 A | 8/1997 | Coleman |
| 5,682,028 A | 10/1997 | Coleman |
| 5,767,538 A | 6/1998 | Mullins et al. |
| 6,205,218 B1 * | 3/2001 | Fischer ............... H03H 11/28 379/345 |

(Continued)

FOREIGN PATENT DOCUMENTS

| | | |
|---|---|---|
| CA | 1292776 C | 12/1991 |
| CN | 103986431 A | 8/2014 |

(Continued)

*Primary Examiner* — Que T Le
(74) *Attorney, Agent, or Firm* — Morris & Kamlay LLP

(57) ABSTRACT

Systems and methods of the disclosed subject matter for converting light into electrical signals are provided including receiving light input and outputting electrical signals proportional to the light input with a sensor, increasing a transimpedance gain of an amplifier to amplify the electrical signals with a T-network of resistors coupled to the amplifier and the sensor, filtering the electrical signals with a filter circuit coupled to the amplifier and the T-network of resistors to increase noise rejection in a predetermined frequency range, and outputting the filtered electrical signals.

14 Claims, 10 Drawing Sheets

(56) References Cited

U.S. PATENT DOCUMENTS

| | | |
|---|---|---|
| 7,196,309 B2 | 3/2007 | Kugelstadt et al. |
| 7,256,384 B2 | 8/2007 | Gottesman et al. |
| 2015/0173621 A1 | 6/2015 | Guo et al. |

FOREIGN PATENT DOCUMENTS

| | | |
|---|---|---|
| EP | 0514592 | 11/1992 |
| WO | 9406223 A1 | 3/1994 |

\* cited by examiner

LIGHT SENSOR READOUT SYSTEM AND METHOD OF CONVERTING LIGHT INTO ELECTRICAL SIGNALS

BACKGROUND

Infrared (IR) light signals can be output using light emitting diodes (LEDs), and can be received by a sensor to convert the light into an electrical signal. That is, IR light can be modulated to form an IR light signal including control signals or other information, and the IR light signal can be detected by a sensor. The sensor and related circuity can convert the light into electrical signals, and output a control signal or a data signal from the recovered electrical signals.

A received IR light signal is typically measured with a photodiode sensor, and can have a current that ranges from 1 pA to 1 nA. To amplify the current, a transimpedance amplifier is typically used with a high-valued resistor, which is generally greater than 10 MΩ. When producing transimpedance amplifiers using high-volume manufacturing techniques, the higher the value of the desired resistance for the resistor of the transimpedance amplifier, the more susceptible the resistor is to temperature, humidity, and contamination, which will degrade the accuracy of the current-to-voltage conversion. Also, typical transimpedance amplifiers generally do not provide adequate rejection of a common mode signal, thereby leaving the current-to-voltage conversion more susceptible to the common mode signal or noise (which could appear as a common mode signal).

BRIEF SUMMARY

Embodiments of the disclosed subject matter provide systems and methods of converting light received by a sensor into electrical signals to be output. The received light may include one or more of visible light, infrared light, and/or ultraviolet light. The systems may include resistors configured in a T-network that are coupled to a transimpedance amplifier to amplify the current from a sensor which converts received light into the current. Embodiments of the disclosed subject matter may include an instrumentation amplifier to replace transimpedance amplifiers in sensor (e.g., photodiode) readout circuitry. The embodiments enhance signal detection by rejection of common mode signals and noise, and by converting the desired signal into a differential signal to further enhance overall sensitivity.

Embodiments of the disclosed subject matter may use an instrumentation amplifier, which may perform signal detection by rejection of common mode signals and noise, and by converting the desired signal into a differential signal further enhancing overall sensitivity. Some embodiments which include the instrumentation amplifier may include a T-network of resistors to provide increased gain without requiring high-valued resistors. That is, the combined instrumentation amplifier and T-network of resistors may achieve a desired common mode rejection and the desired common mode rejection and signal-to-noise ratio.

According to an embodiment of the disclosed subject matter, a system is provided having a sensor to receive light input and to output electrical signals proportional to the light input, an amplifier having an output terminal, a first input terminal connected to an output of the sensor, and a second input terminal to receive a bias voltage, the amplifier to amplify the electrical signals, a first resistor, a second resistor, and a third resistor configured in a T-network connected between the amplifier output terminal and the first input terminal to increase a transimpedance gain of the amplifier, and a first capacitor in parallel with the first resistor, second resistor, and third resistor, and a second capacitor in series with the third resistor to filter the electrical signals in a predetermined frequency range so as to output filtered electrical signals.

According to an embodiment of the disclosed subject matter, a system is provided having a sensor to receive light input and to output electrical signals proportional to the light input, a first amplifier having an output terminal that is coupled to a first resistor, a first input terminal that is connected to an output of the sensor and the first resistor in parallel, and a second input terminal coupled to a voltage source, wherein the first amplifier outputs a portion of a differential signal based on the electrical signals, a second amplifier having an output terminal that is coupled to a second resistor, a first input terminal that is connected to an input of the sensor and with the second resistor in parallel, and a second input terminal coupled to the voltage source, wherein the second amplifier outputs another portion of the differential signal based on the electrical signals, a third resistor coupled to the output of the first amplifier, and a third amplifier having an output terminal that is coupled to a fourth resistor, a first input terminal that is connected to the third resistor and the fourth resistor in parallel, and a second input terminal that is connected to a fifth resistor and a sixth resistor in parallel, wherein the fifth resistor is connected to the output of the second amplifier, and the sixth resistor is connected to the voltage source, wherein the third amplifier rejects at least a portion of a common mode signal to form a filtered signal, and wherein the third amplifier outputs the filtered signal.

According to an embodiment of the disclosed subject matter, a method is provided that includes receiving light input and outputting electrical signals proportional to the light input with a sensor, increasing a transimpedance gain of an amplifier to amplify the electrical signals with a T-network of resistors coupled to the amplifier and the sensor, filtering the electrical signals with a filter circuit coupled to the amplifier and the T-network of resistors to increase noise rejection in a predetermined frequency range, and outputting the filtered electrical signals.

According to an embodiment of the disclosed subject matter, a method is provided that includes receiving light input and outputting electrical signals proportional to the light input with a sensor, converting the electrical signals into a differential signal with a first amplifier and a second amplifier coupled to the sensor, and outputting the differential signal from the first and second amplifiers, rejecting at least a portion of a common mode signal with a third amplifier coupled to the first and second amplifiers to form a filtered signal, and outputting the filtered signal.

According to an embodiment of the disclosed subject matter, means for converting light into electrical signals are provided including receiving light input and outputting electrical signals proportional to the light input with a sensor, increasing a transimpedance gain of an amplifier to amplify the electrical signals with a T-network of resistors coupled to the amplifier and the sensor, filtering the electrical signals with a filter circuit coupled to the amplifier and the T-network of resistors to increase noise rejection in a predetermined frequency range, and outputting the filtered electrical signals.

Additional features, advantages, and embodiments of the disclosed subject matter may be set forth or apparent from consideration of the following detailed description, drawings, and claims. Moreover, it is to be understood that both the foregoing summary and the following detailed description are illustrative and are intended to provide further explanation without limiting the scope of the claims.

BRIEF DESCRIPTION OF THE DRAWINGS

The accompanying drawings, which are included to provide a further understanding of the disclosed subject matter, are incorporated in and constitute a part of this specification. The drawings also illustrate embodiments of the disclosed subject matter and together with the detailed description serve to explain the principles of embodiments of the disclosed subject matter. No attempt is made to show structural details in more detail than may be necessary for a fundamental understanding of the disclosed subject matter and various ways in which it may be practiced.

DETAILED DESCRIPTION

Embodiments of the disclosed subject matter provide systems and methods of converting light received by a sensor into electrical signals to be output. The received light may be visible light, IR light, and/or ultraviolet light. The systems may include resistors configured in a T-network that are coupled to a transimpedance amplifier to amplify the current from a sensor which converts received light into the current. The T-network configuration of resistors avoids the typical use of a single, high-valued resistor, which is often susceptible to temperature, humidity, and contamination, which degrades the accuracy of a conversion (e.g., current to voltage conversion). The embodiments of the disclosed subject matter avoid the use of an additional amplifier that is typically found in other related systems to raise the output signal above a predetermined noise floor. The systems of the disclosed subject matter may have increased suitability for high-volume manufacturing, as they are less susceptible to contaminants and the like, may reduce costs, may reduce circuit area, and/or may improve the signal-to-noise ratio of an output signal.

Embodiments of the disclosed subject matter may include an instrumentation amplifier that can be used instead of conventional transimpedance amplifiers in sensor readout circuitry, such as for photodiodes, phototransistors, or the like. The embodiments may enhance signal detection (e.g., of a particular control and/or data signal from the received light signal) by rejection of common mode signals and/or noise, and by converting the received signal into a differential signal to further enhance overall sensitivity.

Embodiments of the disclosed subject matter may use an instrumentation amplifier instead of transimpedance amplifiers used in other embodiments. Some embodiments that include the instrumentation amplifier may perform signal detection by rejection of common mode signals and noise, and by converting the desired signal into a differential signal further enhancing overall sensitivity. Some embodiments which include the instrumentation amplifier may include a T-network of resistors to provide increased gain without requiring high-valued resistors. That is, the combined instrumentation amplifier and T-network of resistors may achieve a desired common mode rejection and the desired common mode rejection and signal-to-noise ratio. Systems configured according to this embodiment may be adapted to high volume manufacturing.

Figure 1:
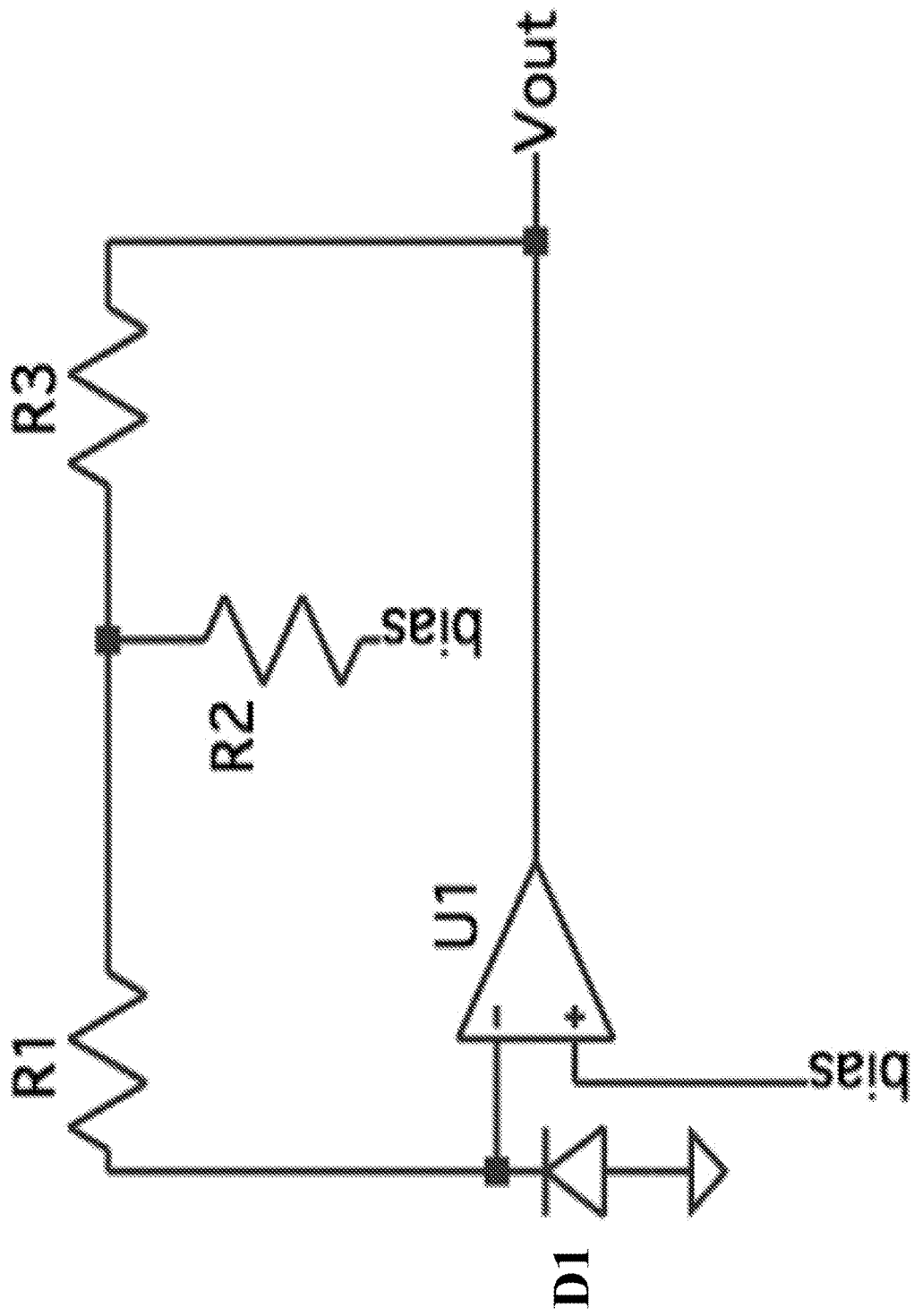
FIG. 1 shows a system having a T-network of resistors according to an embodiment of the disclosed subject matter.
Figure 2:
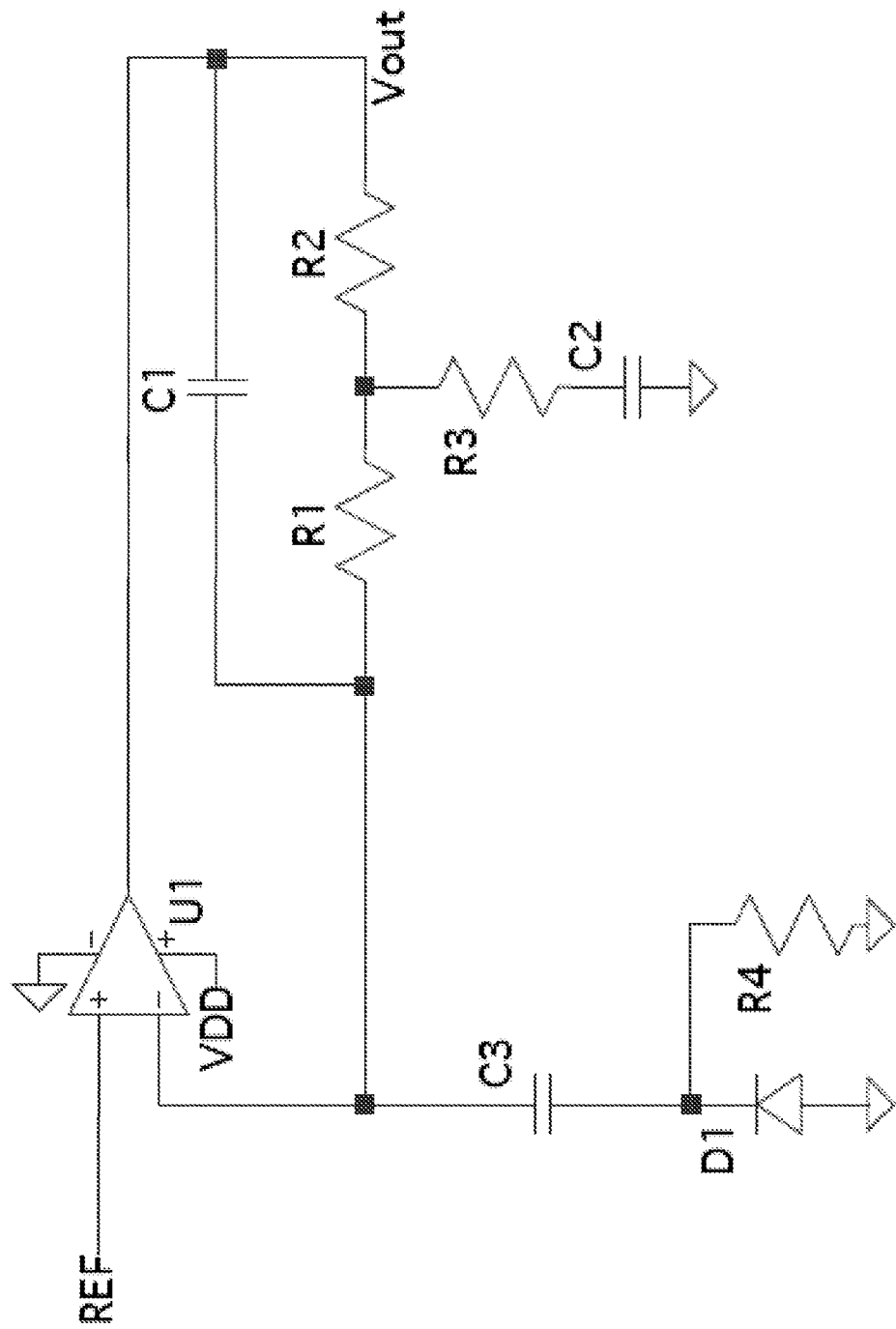
FIG. 2 shows a system having a filter circuit and a T-network of resistors according to an embodiment of the disclosed subject matter.

FIGS. 1-2 show readout circuit systems having transimpedance amplifiers with T-networks of resistors according to embodiments of the disclosed subject matter. FIGS. 3-6 show readout circuits having instrumentation amplifiers, where some embodiments may include T-networks of resistors.

FIG. 1 shows a system (i.e., a readout circuit system) having a T-network of resistors according to an embodiment of the disclosed subject matter. The system may convert a light signal, such as a modulated IR light signal that may include a command signal and/or a data signal, into an electrical signal having the command and/or data signal that may be an output of the system. Although a modulated IR light signal is used in this example, the light signal may be visible light and/or ultraviolet light. FIG. 1 shows a light sensor D1, such as a photodiode, coupled to a T-network of resistors R1, R2, and R3, and an operational amplifier U1. Although a photodiode D1 is shown in FIG. 1, a phototransistor or other suitable light sensor may be user. The photodiode D1, a phototransistor, or other suitable light sensor may detect visible light, IR light, and/or ultraviolet light.

The photodiode D1 of the system may receive light, and convert the received light into electrical signals (i.e., a photocurrent). The output of electrical signals from the photodiode D1 may be received at a first input of the operational amplifier U1, and a second input of the operational amplifier U1 may receive a bias voltage. Resistor R1 may be coupled to the output of the photodiode D1, and to the first input of the operational amplifier U1. Resistor R1 may be coupled to resistors R2 and R3, where resistor R2 is coupled to a bias voltage, and resistor R3 is coupled to the output of the operational amplifier U1 and the output $V_{out}$.

The arrangement of the T-network of resistors R1, R2, and R3 and the operational amplifier U1 may form a transimpedance amplifier. Conventional transimpedance amplifier arrangements typically have a single, high valued resistor, and have an additional amplifier to raise the output signal above a predetermined noise floor. In embodiments disclosed herein, the resistance values of R1, R2, and R3 may be more modest than the resistance of such a high value resistor which may be greater than 10 MΩ. A system such as shown in FIG. 1 with the T-network of resistors may reduce cost, circuit area, and noise compared with conventional light sensor readout circuits which have a single, high-value resistor that may provide the transimpedance stage, or other configurations of read-out circuits having more modest resistor values for the transimpedance stage which require an additional amplifier at the output stage. The equivalent resistance of the T-network is given by $R_{eq}=(R1)[1+(R3/R2)(1+(R2/R1))]$.

The output signal $V_{out}$ may be an electrical signal that includes the control and/or data signal from the received light signal (e.g., IR light signal, visible light signal, and/or ultraviolet light signal), with a signal-to-noise ratio such that the control and/or data signal may be extracted and transmitted to a particular device and/or circuit that is coupled to the system shown in FIG. 1.

FIG. 2 shows a readout circuit system having a filter circuit and a T-network of resistors according to an embodiment of the disclosed subject matter. The system shown in FIG. 2 may include a sensor to receive light input and to output electrical signals proportional to the light input. In some embodiments, the sensor may be a photodiode or a phototransistor. The system may include an operational amplifier having an output terminal, a first input terminal connected to an output of the sensor, and a second input terminal to receive a bias voltage. A first resistor, a second resistor, and a third resistor of the system shown in FIG. 2 may be configured in a T-network that is connected between the operational amplifier output terminal and the first input terminal to increase a transimpedance gain of the operational amplifier. A first capacitor may be disposed in parallel with the first resistor, second resistor, and third resistor, and a second capacitor may be disposed in series with the third resistor. In some embodiments, a fourth resistor may be disposed in parallel with the sensor, and a third capacitor may be coupled to the first input terminal of the operational amplifier. The capacitors may filter the electrical signals in a predetermined frequency range so that the system may output filtered electrical signals.

In particular, as shown in FIG. 2, the system may include an operational amplifier U1 which has a first input which receives a reference signal (REF), and a second input that is coupled to a photodiode D1 via a capacitor C3, as well as a T-network of resistors R1, R2, and R3. A capacitor C1 may be arranged in parallel with resistors R1, R2, and R3, and a capacitor C2 may be arranged in series with resistor R3. Although a photodiode D1 is shown in FIG. 2, D1 may be any suitable light sensor, such as a phototransistor. A resistor, R4, may be disposed in parallel with the photodiode D1, and may be coupled to ground. The capacitors C1, C2, and/or C3 may improve the low frequency performance of the operational amplifier U1 by rejecting electrical disturbances and/or improving noise rejection.

That is, the system disclosed in FIG. 2 may filter noise from an electrical signal that is converted from a received light signal (e.g., an IR light signal, a visible light signal, and/or an ultraviolet light signal) so that the electrical signal provided at $V_{out}$ may have reduced noise. The filtering may be such that the features of the output signal $V_{out}$, which may be a command or include other information, may be discernible and/or extractable, such that they me be transmitted to a device and/or circuit that is coupled to the system shown in FIG. 2.

FIGS. 3-6 show readout circuit systems having instrumentation amplifiers. Readout systems, such as those that typically use transimpedance amplifiers, or those shown in FIGS. 1-2 and described above, may be replaced by the systems shown in FIGS. 3-6. In some embodiments, such as those shown in FIGS. 4-6, one or more T-networks of resistors may be coupled to the instrumentation amplifiers. The instrumentation amplifier systems of the disclosed subject matter may reject common mode and/or noise signals. The instrumentation amplifier systems may convert a modulated light signal (e.g., an IR light signal, a visible light signal, and/or a ultraviolet light signal) received by a sensor that includes command signals and/or data signal, convert the light signal to electrical signals, and convert the electrical signals into a differential signal that includes the command and/or data signals. That is, the systems of FIGS. 4-6 may replace resistors, which would otherwise be coupled to the operational amplifiers, with T-resistor networks with modest value resistors to reduce the costs, manufacturing difficulties, and noise for a particular stage of the system. The T-networks of modest resistors allow for arrangements that avoid the use of high-value resistors, which may be susceptible to temperature, humidity, and/or contamination, which may degrade the accuracy of a current-to-voltage conversion.

Figure 3:
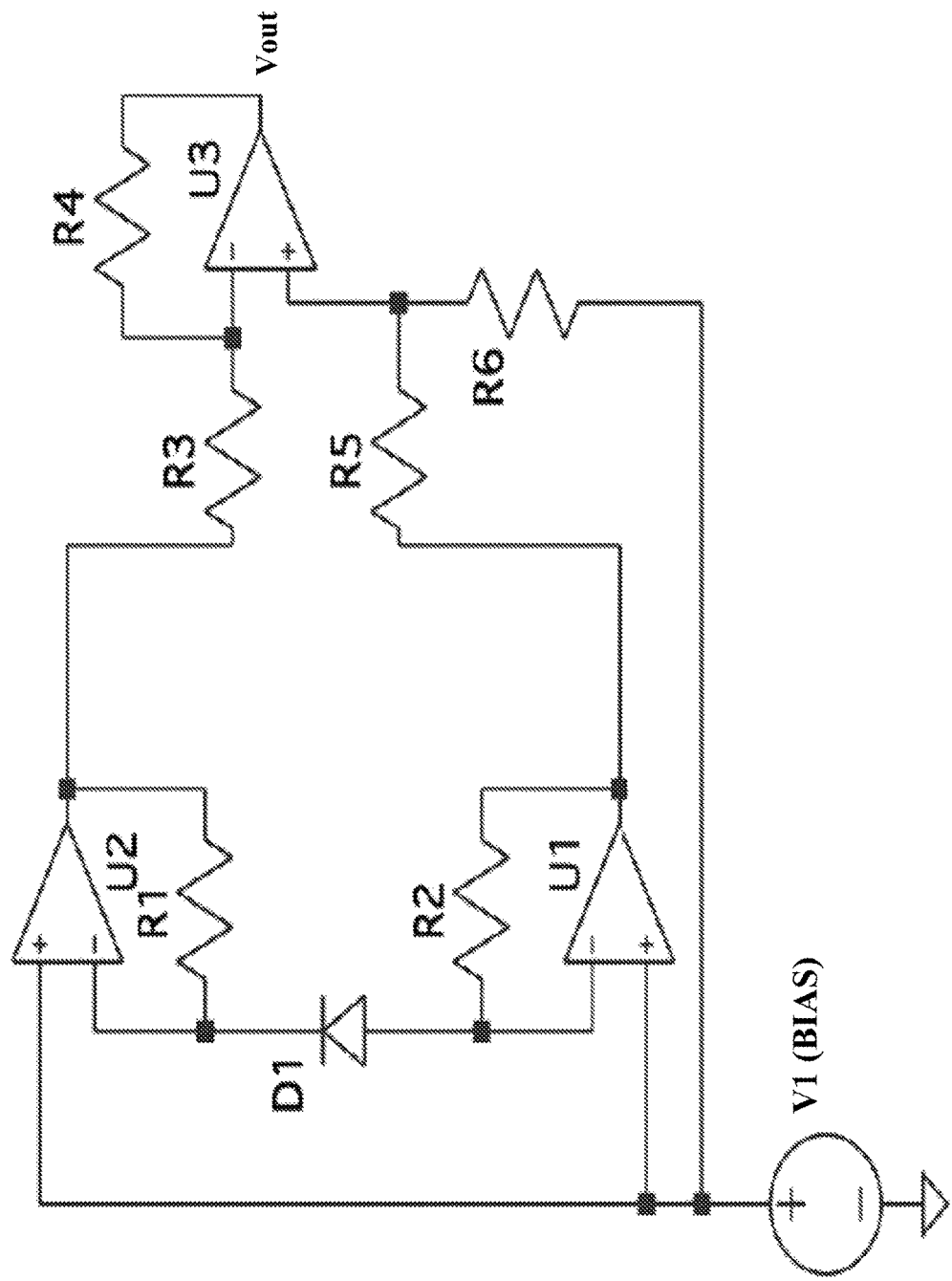
FIG. 3 shows a system to form a differential signal and reject noise in the formed differential signal according to an embodiment of the disclosed subject matter.

FIG. 3 shows a system to generate a differential signal and reject noise in the formed differential signal according to an embodiment of the disclosed subject matter. The system of FIG. 3 includes a sensor to receive light input and to output electrical signals proportional to the light input. In some embodiments, the sensor may be a photodiode or a phototransistor. The system may include a first amplifier (i.e., an operational amplifier) having an output terminal that is coupled to a first resistor, a first input terminal that is connected to an output of the sensor and the first resistor in parallel, and a second input terminal coupled to a voltage source. The first amplifier may output a portion of a differential signal based on the electrical signals. The system may include a second amplifier (i.e., an operational amplifier) having an output terminal that is coupled to a second resistor, a first input terminal that is connected to an input of the sensor and with the second resistor in parallel, and a second input terminal coupled to the voltage source. The second amplifier may output another portion of the differential signal based on the electrical signals. That is, the outputs from the first and second amplifiers may form a differential signal. A third resistor may be coupled to the output of the first amplifier. The system may include a third amplifier (i.e., an operational amplifier) having an output terminal that is coupled to a fourth resistor, a first input terminal that is connected to the third resistor and the fourth resistor in parallel, and a second input terminal that is connected to a fifth resistor and a sixth resistor in parallel. The fifth resistor may be connected to the output of the second amplifier, and the sixth resistor may be connected to the voltage source. In the system shown in FIG. 3, the third amplifier may reject at least a portion of any common mode signal to form a filtered signal, which is output by the third amplifier.

Figure 4:
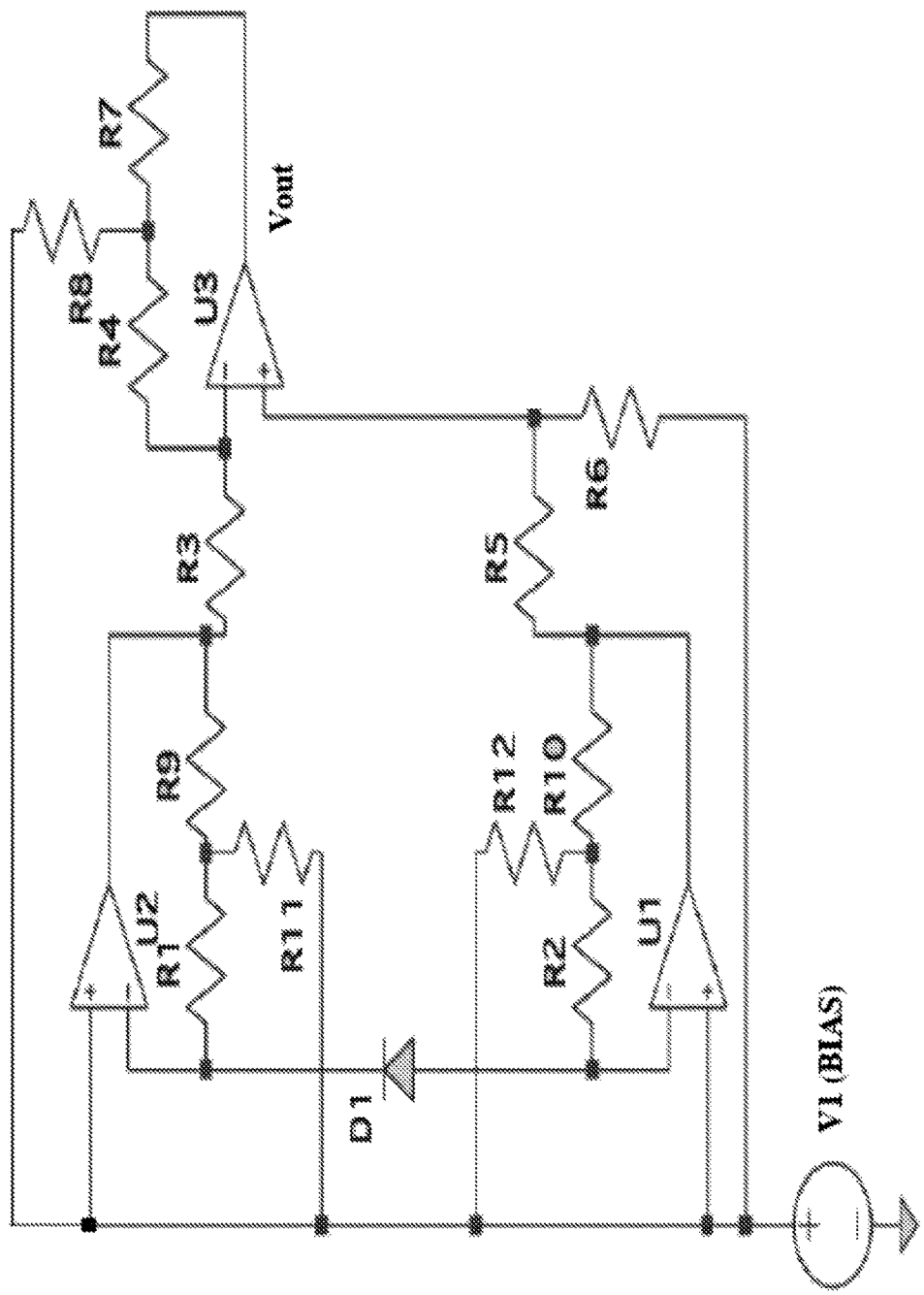
FIG. 4 shows a system similar to the system of FIG. 3, with three T-networks of resistors according to an embodiment of the disclosed subject matter.
Figure 6:
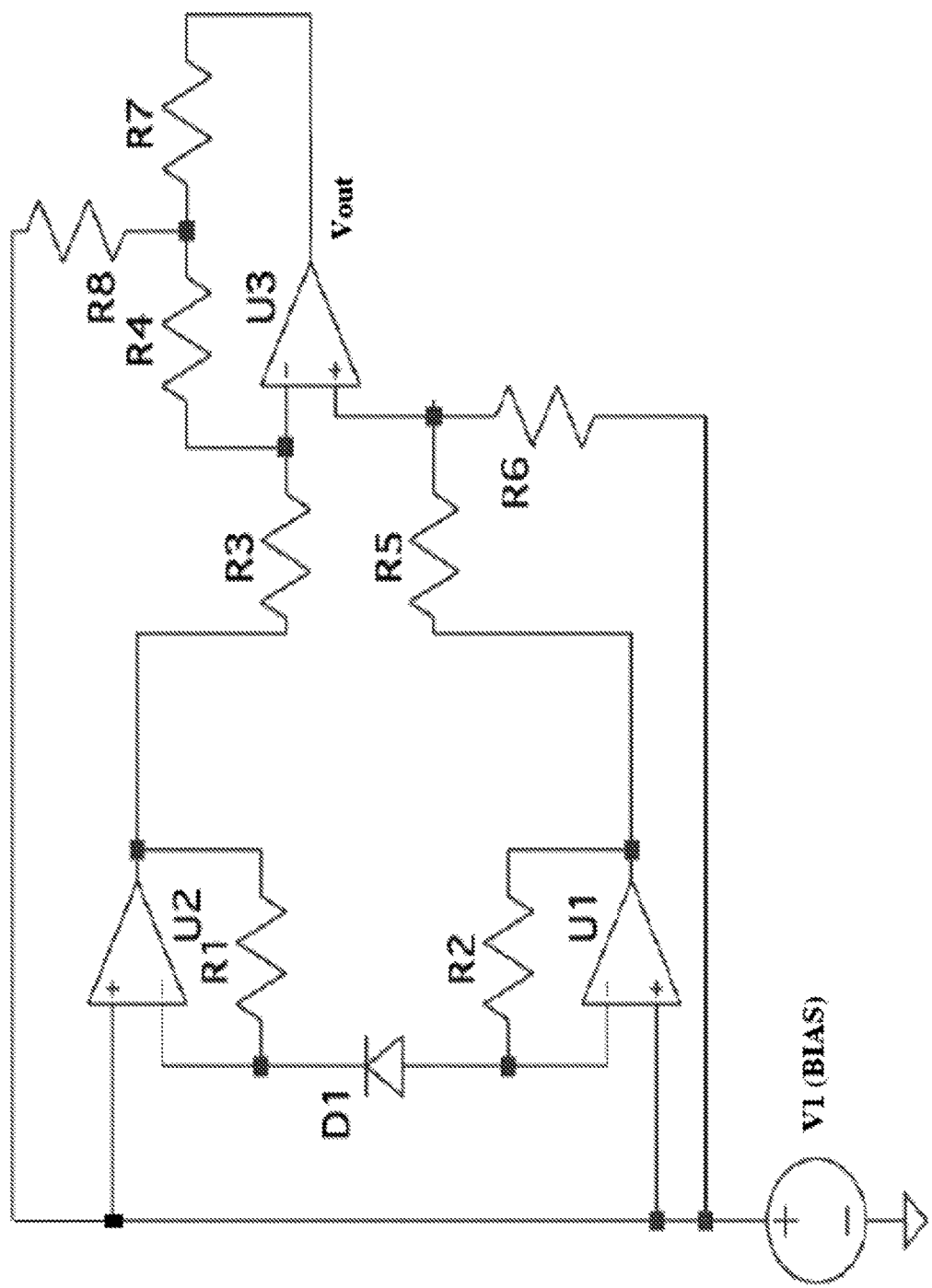
FIG. 6 shows a system similar to the system of FIG. 3, with one T-network of resistors according to an embodiments of the disclosed subject matter.

In some embodiments, such as shown in FIGS. 4 and 6, the system may include a seventh resistor and an eighth resistor connected with the fourth resistor to form a T-network. The seventh resistor may be connected to the output of the third amplifier, and the eighth resistor may be connected to the second input terminal, the fifth resistor, and the sixth resistor.

Figure 5:
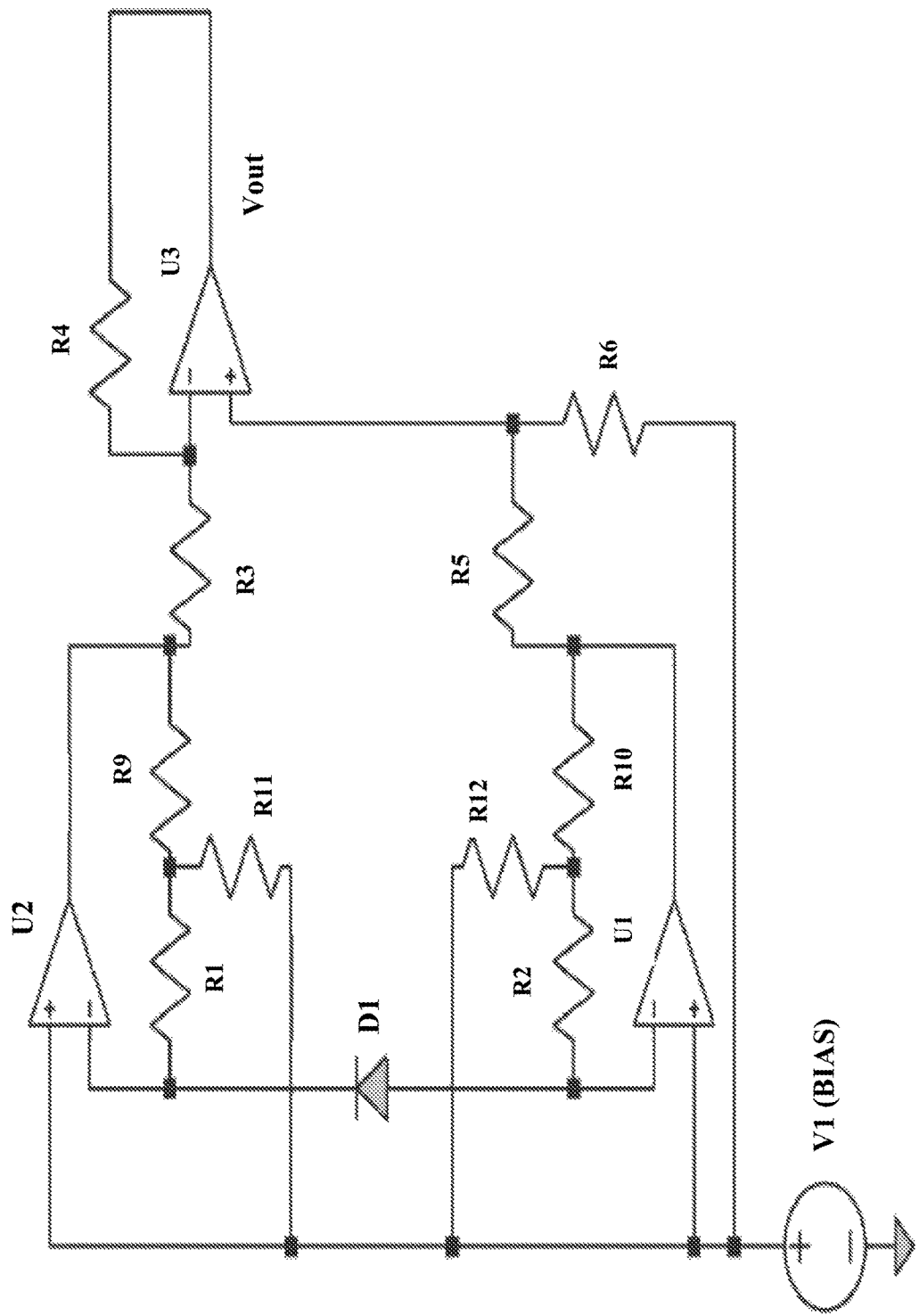
FIG. 5 shows a system similar to the system of FIG. 3, with two T-networks of resistors according to an embodiment of the disclosed subject matter.

The system shown in FIGS. 4-5 may include a ninth resistor and a tenth resistor connected with the first resistor to form a T-network. The ninth resistor may be coupled to the output of the first amplifier and the third resistor, and the tenth resistor may be coupled to the voltage source.

As shown in FIGS. 4-5, the system may include an eleventh resistor and a twelfth resistor connected to the second resistor to form a T-network. The eleventh resistor may be coupled to the output of the second amplifier and the fifth resistor, and the twelfth resistor may be coupled to the voltage source.

In more detail, FIG. 3 shows a system to form a differential signal and reject noise in the formed differential signal according to an embodiment of the disclosed subject matter. That is, the system of FIG. 3 shows an instrumentation amplifier having a photodiode that may convert a modulated light signal (e.g., an IR light signal, a visible light signal, and/or an ultraviolet light signal) into electrical signals, and may convert the electrical signals into a differential signal.

As shown in FIG. 3, the system includes a bias voltage source V1 to provide a voltage to the system. The system may include photodiode D1 as a light sensor to convert light into electrical signals. Although a photodiode is shown in FIG. 3, any suitable light sensor may be used, such as a phototransistor. The photodiode D1, the phototransistor, and/or any suitable light sensor may detect visible light, IR light, and/or ultraviolet light. An operational amplifier U2 may be coupled to the output of the photodiode D1 at a first input, and may receive a voltage from the bias voltage source V1 at a second input. The operational amplifier U2 may have an output that is coupled to a resistor R1, which is also coupled to the first input of the operational amplifier U2. The output of the operational amplifier U2 may include an electrical signal that is a first portion of a differential signal which is provided to a first input of operational amplifier U3. The photodiode D1 may convert a modulated light signal (e.g., a visible light signal, and IR light signal, and/or an ultraviolet light signal) into electrical signals (i.e., a photocurrent), which may be converted into the first portion of the differential signal by the operational amplifier U2. That is, the first portion of the differential signal may be a voltage that is subtracted from the output of operational amplifier U1 by the arrangement of operational amplifier U3 and resistors R3, R4, R5, and R6.

The system may include an operational amplifier U1 which has a first input that is coupled to an input of the photodiode D1, as well as a resistor R2. A second input of the operational amplifier U2 is coupled to the bias voltage source V1. The output from the operational amplifier U1 may be an electrical signal that is a second portion of the differential signal that is provided in a second input of the operational amplifier U3. That is, the second portion of the differential signal may be a voltage that is subtracted from the output of operational amplifier U2 by the arrangement of operational amplifier U3 and resistors R3, R4, R5, and R6.

The operational amplifier U3 may have a first input that is coupled to a resistor R3 and a resistor R4. A second input of the operational amplifier U3 may be coupled to a resistor R5 and a resistor R6. The resistor R5 may be coupled to the output of the amplifier U1, and the resistor R6 may be coupled to the bias voltage source V1. An output of the operational amplifier U3 may be coupled to the resistor R4.

The operational amplifier U3 may reject at least a portion of a common mode signal that is output by the operational amplifiers U1 and U2 to form a filtered signal, which is output by the operational amplifier U3. The system shown in FIG. 3 may enhance signal detection (e.g., detection of commands and/or data from the modulated light received by the photodiode D1) by rejection of common mode signals and noise. That is, the system of FIG. 3 may convert a modulated light signal (e.g., a visible light signal, an IR light signal, and/or a ultraviolet light signal) into electrical signals, form a differential signal using the operational amplifiers U1 and U2, reduce the noise from the differential signal, and form an output signal having a control and/or data signal from the modulated light signal.

FIG. 4 shows the system of FIG. 3, as described above, with three T-networks of resistors according to an embodiment of the disclosed subject matter. Resistors R9 and R11 may be coupled to resistor R1 to form a first T-network of resistors. The resistor R9 may be coupled to the output of the operational amplifier U2, and to the resistor R3. The resistor R11 may be coupled in parallel to the resistors R1 and R9, and to the bias voltage source V1.

As shown in FIG. 4, the resistor R2 may be coupled in parallel to a resistor R10 and a resistor R12 to form a second T-network. The resistor R10 may be coupled to the output of the operational amplifier U1 and to the resistor R5. The resistor R12 may be coupled to the bias voltage source V1.

The resistor R4 may be coupled to resistor R8 and resistor R7 to form a third T-network of resistors. Resistor R8 may be coupled to the second input of the operational amplifier U2, the bias voltage V1, the resistor R4, and the resistor R7.

The operational amplifier U2 and the T-network of resistors R1, R9, and R11 may output the first portion of the differential signal. That is, the first portion of the differential signal may be a voltage that is subtracted from the output of operational amplifier U1 by the arrangement of operational amplifier U3 and resistors R3, R4, R5, R6, R7 and R8. The operational amplifier U1 and the T-network of resistors R2, R10, and R12 may output the second portion of the differential signal. That is, the second portion of the differential signal may be a voltage that is subtracted from the output of operational amplifier U2 by the arrangement of operational amplifier U3 and resistors R3, R4, R5, R6, R7 and R8. The operational amplifier U3 and the T-network of resistors R4, R7, and R8 may reject at least a portion of a common mode signal from operational amplifiers U1 and U2, which is filtered and output by the operational amplifier U3. That is, the system of FIG. 4 may convert a modulated light signal (e.g., a visible light signal, an IR light signal, and/or a ultraviolet light signal) into electrical signals (i.e., a photocurrent), form a differential signal using the operational amplifiers U1 and U2, reduce the noise from the differential signal and form an output signal having a control and/or data signal from the modulated light signal with the operational amplifier U3.

FIG. 5 shows a system to form a differential signal and reject noise in the formed differential signal according to an embodiment of the disclosed subject matter. The system includes a bias voltage source V1 to provide a voltage to the system. FIG. 5 shows that the system includes photodiode D1 as a light sensor to convert light (e.g., an IR light signal, a visible light signal, and/or an ultraviolet light signal) into electrical signals (i.e., a photocurrent). Although a photodiode is shown in FIG. 5, any suitable light sensor may be used, such as a phototransistor. An operational amplifier U2 may be coupled to the output of the photodiode D1 at a first input, and may receive a voltage from a bias voltage source V1 at a second input. A T-network of resistors R1, R9, and R11 may be coupled in parallel to the second input, as well as the output, of the operational amplifier. Resistor R11 may be coupled to the bias voltage source V1. The resistor R9 may be coupled to a resistor R3. The output of the operational amplifier U2 may include an electrical signal that is a first portion of a differential signal which is provided to a first input of operational amplifier U3. That is, the photodiode D1 may convert the received modulated light signal (e.g., an IR light signal, a visible light signal, and/or a ultraviolet light signal) to electrical signals (i.e., a photocurrent), and the operational amplifier U2 may convert the electrical signals to the first portion of the differential signal. The first portion of the differential signal may be a voltage that is generated from the output of operational amplifiers U1 and U2 by the arrangement of operational amplifier U3 and resistors R3, R4, R5, and R6.

The system may include an operational amplifier U1 which has a first input that is coupled to an input of the photodiode D1, as well as to a T-network of resistors including R2, R10, and R12. The resistor R10 is coupled to resistor R5. A second input of the operational amplifier U1 may be coupled to the bias voltage source V1. The output from the operational amplifier U1 may be an electrical signal that is a second portion of the differential signal that is provided in a second input of the operational amplifier U3. The second portion of the differential signal may be a voltage that is subtracted from the output of operational amplifier U2 by the arrangement of operational amplifier U3 and resistors R3, R4, R5, and R6.

The operational amplifier U3 may have a first input that is coupled to the resistor R3 and a resistor R4. A second input of the operational amplifier U3 may be coupled to the resistor R5 and a resistor R6. The resistor R5 may be coupled to the output of the operational amplifier U1, and the resistor R6 may be coupled to the bias voltage source V1. An output of the operational amplifier U3 may be coupled to the resistor R4. The operational amplifier U3 may reject at least a portion of a common mode signal to form a filtered signal, which is output by the operational amplifier U3. The system shown in FIG. 5 may enhance signal detection (e.g., detection of commands and/or data from the modulated light received by the photodiode D1) by rejection of common mode signals and noise, and by converting the received signal into a differential signal using the operational amplifiers U1 and U2.

FIG. 6 shows a system similar to that of FIG. 3 with one T-network of resistors according to an embodiments of the disclosed subject matter. The system of FIG. 3 is discussed above, and the system of FIG. 6 includes T-network of resistors R4, R7, and R8 coupled to the operational amplifier U3, similar to the system shown in FIG. 4 and discussed above. The operational amplifier U3 and the T-network of resistors R4, R7, and R8 may reject at least a portion of a common mode signal from operational amplifiers U1 and U2 to form the filtered signal that is output by the operational amplifier U3.

Figure 7:
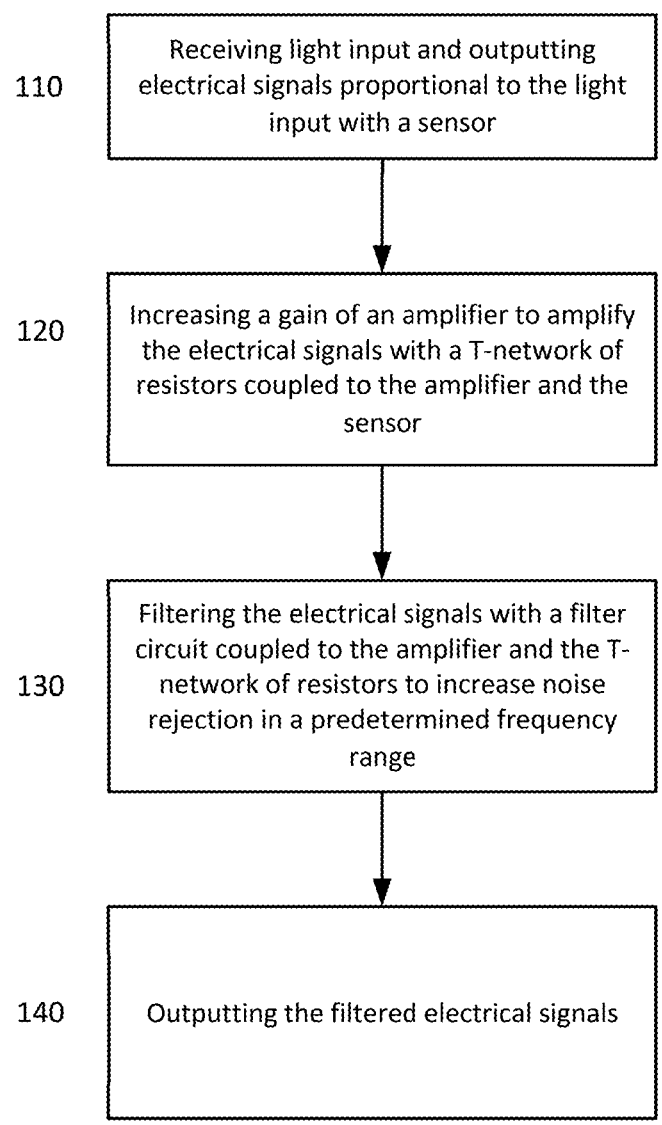
FIG. 7 shows an example method of converting light into electrical signals according to an embodiment of the disclosed subject matter.

FIG. 7 shows an example method 100 of converting light into electrical signals according to an embodiment of the disclosed subject matter. A sensor, such as the photodiode D1 shown in FIG. 1-6 or a phototransistor, may receive light input (e.g., a modulated IR light signal, a visible light signal, and/or an ultraviolet light signal), and may output electrical signals proportional to the light input in operation 110. A transimpedance gain (e.g., gain of operational amplifier U1 shown in FIG. 2) may be increased so as to amplify the electrical signals with a T-network of resistors (e.g., resistors R1, R2, and R3 shown in FIG. 2) in operation 120. The electrical signals may be filtered with a filter circuit (e.g., a circuit that includes one or more of capacitors C1, C2, and C3 shown in FIG. 2) coupled to the amplifier and the T-network of resistors to increase noise rejection in a predetermined frequency range at operation 130. For example, the filter may be a band pass filter which improves the low-frequency performance of the amplifier. That is, the filter may reject electrical disturbance and/or noise (e.g., from other devices) below a predetermined range. At operation 140, the filtered electrical signals may be output. That is, the method 100 may convert a received modulated light signal that may include control and/or data signals into electrical signals, and may output a filtered signal that includes the control and/or data signals. The filtered output signal may be transmitted to a device and/or circuit.

Figure 8:
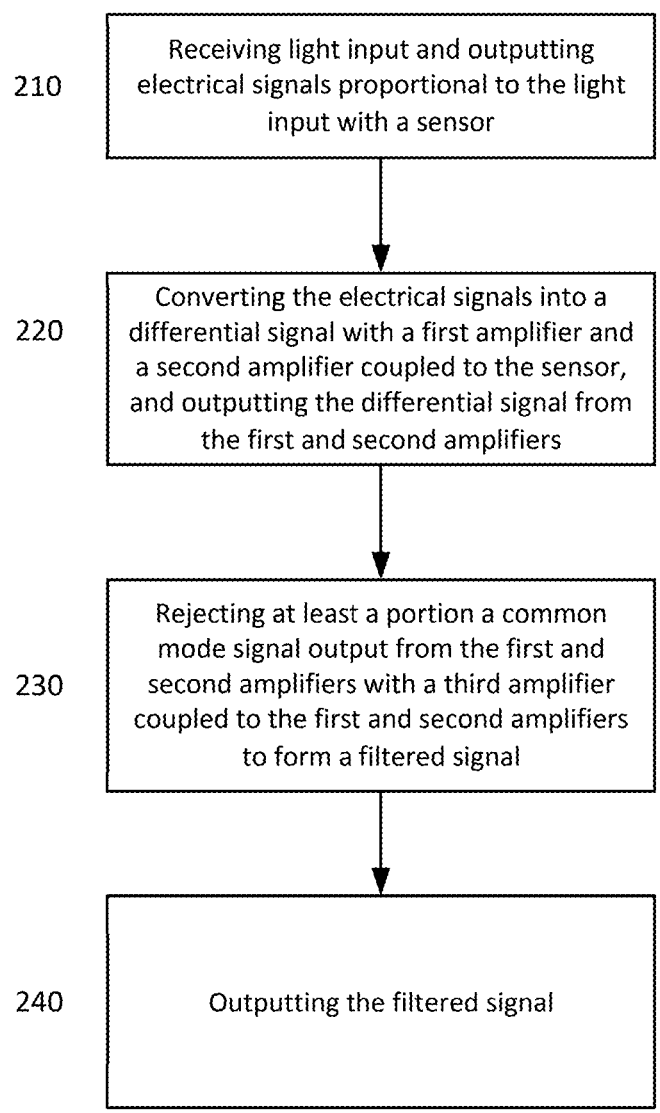
FIG. 8 shows another example method of converting light into electrical signals according to an embodiment of the disclosed subject matter.

FIG. 8 shows an example method 200 of converting light into electrical signals according to an embodiment of the disclosed subject matter. A sensor, such as the photodiode D1 shown in FIG. 3 or a phototransistor, may receive light input (e.g., a modulated IR light signal, a visible light signal, and/or a ultraviolet light signal), and may output electrical signals proportional to the light input at operation 210. Electrical signals from the sensor are converted into a differential signal with a first amplifier (e.g., operational amplifier U1 shown in FIG. 3) and a second amplifier (e.g., operational amplifier U2 shown in FIG. 3) coupled to the sensor, and the amplifiers may output the differential signal at operation 220. At least a portion of a common mode signal output from the first and second amplifiers may be rejected with a third amplifier (e.g., operational amplifier U3 shown in FIG. 3) coupled to the first and second amplifiers to form a filtered signal at operation 230. At operation 240, the filtered signal may be output.

Figure 9:
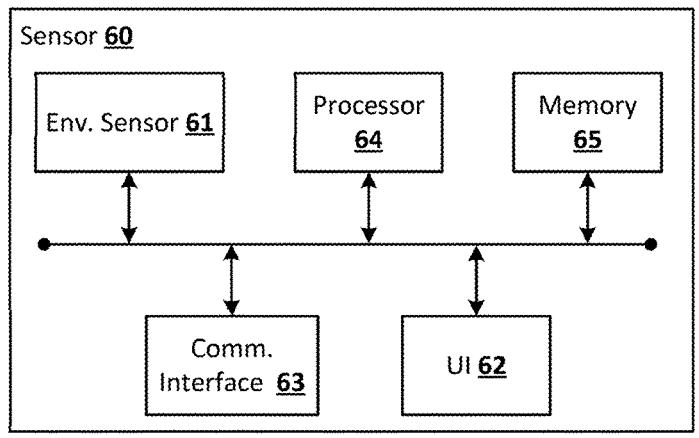
FIG. 9 shows an example sensor according to an embodiment of the disclosed subject matter.

The light to electrical signal conversion systems of the disclosed subject matter may be communicatively coupled to a smart-home environment, such as the smart-home environment shown in FIG. 9. In the context of the smart-home environment, a "sensor" may refer to any device that can obtain information about its environment. Sensors may be described by the type of information they collect. For example, sensor types as disclosed herein may include light, motion, smoke, carbon monoxide, proximity, temperature, time, physical orientation, acceleration, location, entry, presence, pressure, sound, and the like. A sensor also may be described in terms of the particular physical device that obtains the environmental information. For example, an accelerometer may obtain acceleration information, and thus may be used as a general motion sensor and/or an acceleration sensor. A sensor also may be described in terms of the specific hardware components used to implement the sensor. For example, a temperature sensor may include a thermistor, thermocouple, resistance temperature detector, integrated circuit temperature detector, or combinations thereof. A light sensor may be a photodiode, a phototransistor, or the like. A sensor also may be described in terms of a function or functions the sensor performs within an integrated sensor network, such as a smart home environment as disclosed herein. For example, a sensor may operate as a security sensor when it is used to determine security events such as unauthorized entry. A sensor may operate with different functions at different times, such as where a motion sensor is used to control lighting in a smart home environment when an authorized user is present, and is used to alert to unauthorized or unexpected movement when no authorized user is present, or when an alarm system is in an "armed" state, or the like. In some cases, a sensor may operate as multiple sensor types sequentially or concurrently, such as where a temperature sensor is used to detect a change in temperature, as well as the presence of a person or animal. A sensor also may operate in different modes at the same or different times. For example, a sensor may be configured to operate in one mode during the day and another mode at night. As another example, a sensor may operate in different modes based upon a state of a home security system or a smart home environment, or as otherwise directed by such a system.

Data generated by one or more sensors may indicate patterns in the behavior of one or more users and/or an environment state over time, and thus may be used to "learn" such characteristics. For example, data generated by a light sensor of a smart-home network as to when IR light signals (or, alternatively, visible light signals and/or ultraviolet light signals) are received to control one or more devices of the network and/or to control a security system of the smart-home network so as to gain entry or to arm the security system may be stored in a local or remote storage medium with the permission of an end user. A processor in communication with the storage medium may compute a behavior based on the data generated by the light sensor. For example, signals transmitted via IR light, visible light, and/or ultraviolet light may be received by the light sensor, the light may be converted to electrical signals, which may be used to control one or more functions of devices coupled to the smart-home network.

In general, a "sensor" as disclosed herein may include multiple sensors or sub-sensors, such as where a sensor may include a light sensor (e.g., a photodiode or phototransistor) and one or more other sensors. Multiple sensors may be arranged in a single physical housing, such as where a single device includes movement, temperature, magnetic, and/or other sensors. Such a housing also may be referred to as a sensor or a sensor device. For clarity, sensors are described with respect to the particular functions they perform and/or the particular physical hardware used, when such specification is necessary for understanding of the embodiments disclosed herein.

A sensor of the smart-home environment may include hardware, in addition to the specific physical sensor that obtains information about the environment. FIG. 9 shows an example sensor as disclosed herein. The sensor 60 may include an environmental sensor 61, such as a light sensor, temperature sensor, smoke sensor, carbon monoxide sensor, motion sensor, accelerometer, proximity sensor, passive infrared (PIR) sensor, magnetic field sensor, radio frequency (RF) sensor, humidity sensor, pressure sensor, microphone, or any other suitable environmental sensor, that obtains a corresponding type of information about the environment in which the sensor 60 is located. A processor 64 may receive and analyze data obtained by the sensor 61, control operation of other components of the sensor 60, and process communication between the sensor and other devices. The processor 64 may execute instructions stored on a computer-readable memory 65. The memory 65 or another memory in the sensor 60 may also store environmental data obtained by the sensor 61. A communication interface 63, such as a Wi-Fi or other wireless interface, Ethernet or other local network interface, or the like may allow for communication by the sensor 60 with other devices. A user interface (UI) 62 may provide information and/or receive input from a user of the sensor. The UI 62 may include, for example, a speaker to output an audible alarm when an event is detected by the sensor 60. Alternatively, or in addition, the UI 62 may include a light to be activated when an event is detected by the sensor 60. The user interface may be relatively minimal, such as a limited-output display, or it may be a full-featured interface such as a touchscreen. Components within the sensor 60 may transmit and receive information to and from one another via an internal bus or other mechanism as will be readily understood by one of skill in the art. One or more components may be implemented in a single physical arrangement, such as where multiple components are implemented on a single integrated circuit. Sensors as disclosed herein may include other components, and/or may not include all of the illustrative components shown.

Sensors of the smart-home environment as disclosed herein may operate within a communication network, such as a conventional wireless network, and/or a sensor-specific network through which sensors may communicate with one another and/or with dedicated other devices. In some configurations one or more sensors may provide information to one or more other sensors, to a central controller, or to any other device capable of communicating on a network with the one or more sensors. A central controller may be general- or special-purpose. For example, one type of central controller is a home automation network that collects and analyzes data from one or more sensors within the home. Another example of a central controller is a special-purpose controller that is dedicated to a subset of functions, such as a security controller that collects and analyzes sensor data primarily or exclusively as it relates to various security considerations for a location. A central controller may be located locally with respect to the sensors with which it communicates and from which it obtains sensor data, such as in the case where it is positioned within a home that includes a home automation and/or sensor network. Alternatively or in addition, a central controller as disclosed herein may be remote from the sensors, such as where the central controller is implemented as a cloud-based system that communicates with multiple sensors, which may be located at multiple locations and may be local or remote with respect to one another.

Figure 10:
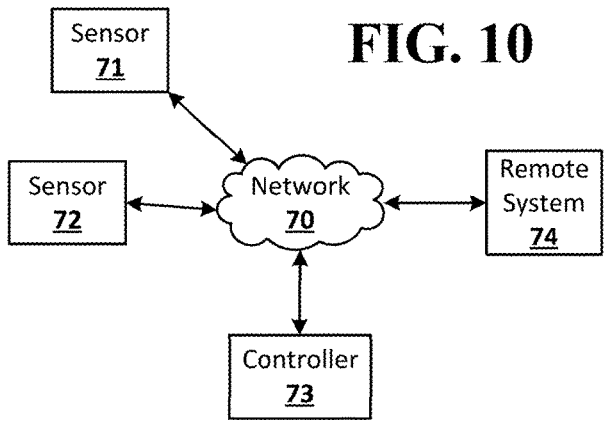
FIG. 10 shows a system that includes example sensors according to an embodiment of the disclosed subject matter.

FIG. 10 shows an example of a sensor network as disclosed herein, which may be implemented over any suitable wired and/or wireless communication networks. One or more sensors 71, 72 may communicate via a local network 70, such as a Thread network, Wi-Fi, or other suitable network, with each other and/or with a controller 73. The controller may be a general- or special-purpose computer. The controller may, for example, receive, aggregate, and/or analyze environmental information received from the sensors 71, 72. The sensors 71, 72 and the controller 73 may be located locally to one another, such as within a single dwelling, office space, building, room, or the like, or they may be remote from each other, such as where the controller 73 is implemented in a remote system 74 such as a cloud-based reporting and/or analysis system. Alternatively or in addition, sensors may communicate directly with a remote system 74. The remote system 74 may, for example, aggregate data from multiple locations, provide instruction, software updates, and/or aggregated data to a controller 73 and/or sensors 71, 72.

The controller 73 and/or remote system 74 may determine that light has been received by the sensor 71, 72, may control an operation of one or more devices coupled to the network 70 (e.g., sensors 71, 72, a lighting system, thermostat, an HVAC system, cameras, or the like). The controller 73 and/or remote system 74 may be a computer (e.g., a desktop computer, laptop computer, server, tablet, or the like) or other portable electronic device (e.g., a smartphone, smart watch, wearable computing device, fitness band, a tablet, a key fob, and the like).

The sensor network shown in FIG. 10 may be an example of the smart-home environment. The depicted smart-home environment may include a structure, a house, office building, garage, mobile home, or the like. The devices of the smart home environment, such as the sensors 71, 72, the controller 73, and the network 70 may be integrated into a smart-home environment that does not include an entire structure, such as an apartment, condominium, or office space.

The smart home environment can control and/or be coupled to devices outside of the structure. For example, one or more of the sensors 71, 72 may be located outside the structure, for example, at one or more distances from the structure (e.g., sensors 71, 72 may be disposed outside the structure, at points along a land perimeter on which the structure is located, and the like. One or more of the devices in the smart home environment need not physically be within the structure. For example, the controller 73 which may receive input from the sensors 71, 72 may be located outside of the structure.

The structure of the smart-home environment may include a plurality of rooms, separated at least partly from each other by walls. The walls can include interior walls or exterior walls. Each room can further include a floor and a ceiling. Devices of the smart-home environment, such as the sensors 71, 72, may be mounted on, integrated with and/or supported by a wall, floor, or ceiling of the structure.

The smart-home environment including the sensor network shown in FIG. 10 may include a plurality of devices, including intelligent, multi-sensing, network-connected devices that can integrate seamlessly with each other and/or with a central server or a cloud-computing system (e.g., controller 73 and/or remote system 74) to provide home-security and smart-home features. The smart-home environment may include one or more intelligent, multi-sensing, network-connected thermostats (e.g., "smart thermostats"), one or more intelligent, network-connected, multi-sensing hazard detection units (e.g., "smart hazard detectors"), and one or more intelligent, multi-sensing, network-connected entryway interface devices (e.g., "smart doorbells"). The smart hazard detectors, smart thermostats, and smart doorbells may be the sensors 71, 72 shown in FIG. 10.

For example, a smart thermostat may detect ambient climate characteristics (e.g., temperature and/or humidity) and may control an HVAC (heating, ventilating, and air conditioning) system accordingly of the structure. For example, the ambient client characteristics may be detected by sensors 71, 72 shown in FIG. 10, and the controller 73 may control the HVAC system (not shown) of the structure.

As another example, a smart hazard detector may detect the presence of a hazardous substance or a substance indicative of a hazardous substance (e.g., smoke, fire, or carbon monoxide). For example, smoke, fire, and/or carbon monoxide may be detected by sensors 71, 72 shown in FIG. 10, and the controller 73 may control an alarm system to provide a visual and/or audible alarm to the user of the smart-home environment.

As another example, a smart doorbell may control doorbell functionality, detect a person's approach to or departure from a location (e.g., an outer door to the structure), and announce a person's approach or departure from the structure via audible and/or visual message that is output by a speaker and/or a display coupled to, for example, the controller 73.

In embodiments of the disclosed subject matter, the smart-home environment may include one or more intelligent, multi-sensing, network-connected entry detectors (e.g., "smart entry detectors"). Such detectors may be or include one or more of the sensors 71, 72 shown in FIG. 6. The detectors may include a light sensor to sense, e.g., light from a device of a user, where the light may be modulated with information (e.g., authentication information, a security code, an entry code, or the like). The illustrated smart entry detectors (e.g., sensors 71, 72) may be disposed at one or more windows, doors, and other entry points of the smart-home environment, and may detect when a window, door, or other entry point is opened, broken, breached, and/or compromised. The smart entry detectors may generate a corresponding signal to be provided to the controller 73 and/or the remote system 74 when a window or door is opened, closed, breached, and/or compromised, and/or when a light signal (e.g., IR light, visible light, and/or ultraviolet light) is received by the sensors 71, 72 with a command and/or information (e.g., authorization information, a command to change a security state so that a user may enter or to change the state after a user has exited). In some embodiments of the disclosed subject matter, the alarm system, which may be included with controller 73 and/or coupled to the network 70 may not arm unless all smart entry detectors (e.g., sensors 71, 72) indicate that all doors, windows, entryways, and the like are closed and/or that all smart entry detectors are armed, and/or a light signal has been received to arm the security system.

The smart-home environment of the sensor network shown in FIG. 10 can include one or more intelligent, multi-sensing, network-connected doorknobs (e.g., "smart doorknob"). For example, the sensors 71, 72 may be coupled to a doorknob of a door (e.g., doorknobs 122 located on external doors of the structure of the smart-home environment). However, it should be appreciated that smart doorknobs can be provided on external and/or internal doors of the smart-home environment.

The smart thermostats, the smart hazard detectors, the smart doorbells, the smart wall switches, the smart wall plugs, the smart entry detectors, the smart doorknobs, the keypads, and other devices of a smart-home environment (e.g., as illustrated as sensors 71, 72 of FIG. 10 can be communicatively coupled to each other via the network 70, and to the controller 73 and/or remote system 74 to provide security, safety, and/or comfort for the smart home environment). The light sensors that may be included with sensors 71, 72 may receive modulated light from, for example, a user device, to control one or more of the smart thermostats, the smart hazard detectors, the smart doorbells, the smart wall switches, the smart wall plugs, the smart entry detectors, the smart doorknobs, the keypads, and other devices of a smart-home environment. That is, the sensors 71, 72 may convert the received light into electrical signals, which may include one or more commands and/or authorization information).

A user can interact with one or more of the network-connected smart devices (e.g., via the network 70). For example, a user can communicate with one or more of the network-connected smart devices using a computer (e.g., a desktop computer, laptop computer, tablet, or the like) or other portable electronic device (e.g., a smartphone, a tablet, a key fob, and the like). The communication may be via light (e.g., IR light, visible light, and/or ultraviolet light) that may be transmitted from the computer or portable electronic device to the sensors 71, 72. In some embodiments, a webpage or application can be configured to receive communications from the user and control the one or more of the network-connected smart devices based on the communications and/or to present information about the device's operation to the user. For example, the user can view can arm or disarm the security system of the home.

One or more users can control one or more of the network-connected smart devices in the smart-home environment using a network-connected computer or portable electronic device. In some examples, some or all of the users (e.g., individuals who live in the home) can register their device (e.g., smartphone, smart watch, wearable computing device, fitness band, key FOB, RFID tag, tablet computer, laptop computer, personal computer, or the like) with the smart-home environment (e.g., with the controller 73). Such registration can be made at a central server (e.g., the controller 73 and/or the remote system 74) to authenticate the user and/or the electronic device as being associated with the smart-home environment, and to provide permission to the user to use the electronic device to control the network-connected smart devices and the security system of the smart-home environment. A user can use their registered electronic device to remotely control the network-connected smart devices and security system of the smart-home environment, such as when the occupant is at work or on vacation. The user may also use their registered electronic device to control the network-connected smart devices when the user is located inside the smart-home environment and/or within a predetermined perimeter outside of the smart-home environment (e.g., where the device emits modulated light that may be detected by the sensors 71, 72, and where the detected modulated light may be converted to control signals for one or more devices of the smart-home environment).

Alternatively, or in addition to registering electronic devices, the smart-home environment may make inferences about which individuals live in the home and are therefore users and which electronic devices are associated with those individuals. As such, the smart-home environment may "learn" who is a user (e.g., an authorized user) and permit the electronic devices associated with those individuals to control the network-connected smart devices of the smart-home environment (e.g., devices communicatively coupled to the network 70), in some embodiments including sensors used by or within the smart-home environment. Various types of notices and other information may be provided to users via messages sent to one or more user electronic devices. For example, the messages can be sent via IR light, email, short message service (SMS), multimedia messaging service (MMS), unstructured supplementary service data (USSD), as well as any other type of messaging services and/or communication protocols.

A smart-home environment may include communication with devices outside of the smart-home environment but within a proximate geographical range of the home. For example, the smart-home environment may include an outdoor lighting system (not shown) that communicates information through the communication network 70 or directly to a central server or cloud-computing system (e.g., controller 73 and/or remote system 74) regarding detected movement and/or presence of people, animals, and any other objects and receives back commands for controlling the lighting accordingly. The smart-home environment may communicate with a user device via modulated light (e.g., IR light, visible light, and/or ultraviolet light) that is emitted from the device towards the sensors 71, 72. The sensors 71, 72 may receive the modulated light, and convert it into one or more electrical signals to control devices of the smart-home environment.

The controller 73 and/or remote system 74 can control a lighting system (including light sources 33), including an outdoor lighting system, based on information received from the other network-connected smart devices in the smart-home environment. For example, in the event, any of the network-connected smart devices, such as smart wall plugs located outdoors, detect movement at night time, the controller 73 and/or remote system 74 can activate the outdoor lighting system and/or other lights in the smart-home environment.

Figure 11:
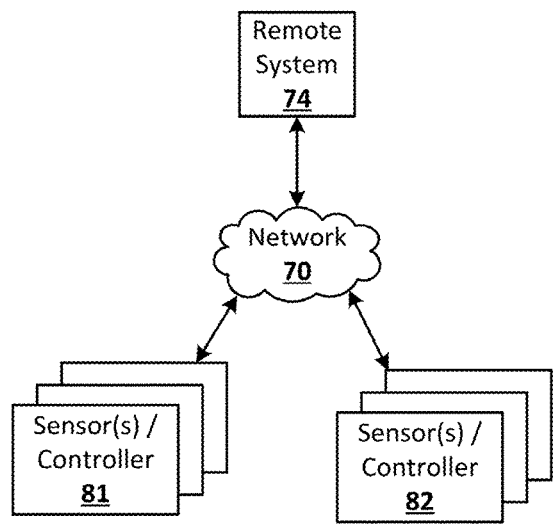
FIG. 11 shows a system with a plurality of sensors and controllers coupled to a network and a remote system according to an embodiment of the disclosed subject matter.

In some configurations of the smart-home environment, as shown in FIG. 11, a remote system 74 may aggregate data from multiple locations, such as multiple buildings, multi-resident buildings, individual residences within a neighborhood, multiple neighborhoods, and the like. In general, multiple sensor/controller systems 81, 82 as previously described with respect to FIG. 10 may provide information to the remote system 74. The systems 81, 82 may provide data directly from one or more sensors as previously described, or the data may be aggregated and/or analyzed by local controllers such as the controller 73, which then communicates with the remote system 74. The remote system may aggregate and analyze the data from multiple locations, and may provide aggregate results to each location. For example, the remote system 74 may examine larger regions for common sensor data or trends in sensor data, and provide information on the identified commonality or environmental data trends to each local system 81, 82.

In situations in which the systems discussed here collect personal information about users, or may make use of personal information, the users may be provided with an opportunity to control whether programs or features collect user information (e.g., information about a user's social network, social actions or activities, profession, a user's preferences, or a user's current location), or to control whether and/or how to receive content from the content server that may be more relevant to the user. In addition, certain data may be treated in one or more ways before it is stored or used, so that personally identifiable information is removed. For example, specific information about a user's residence may be treated so that no personally identifiable information can be determined for the user, or a user's geographic location may be generalized where location information is obtained (such as to a city, ZIP code, or state level), so that a particular location of a user cannot be determined. As another example, systems disclosed herein may allow a user to restrict the information collected by those systems to applications specific to the user, such as by disabling or limiting the extent to which such information is aggregated or used in analysis with other information from other users. Thus, the user may have control over how information is collected about the user and used by a system as disclosed herein.

Figure 12:
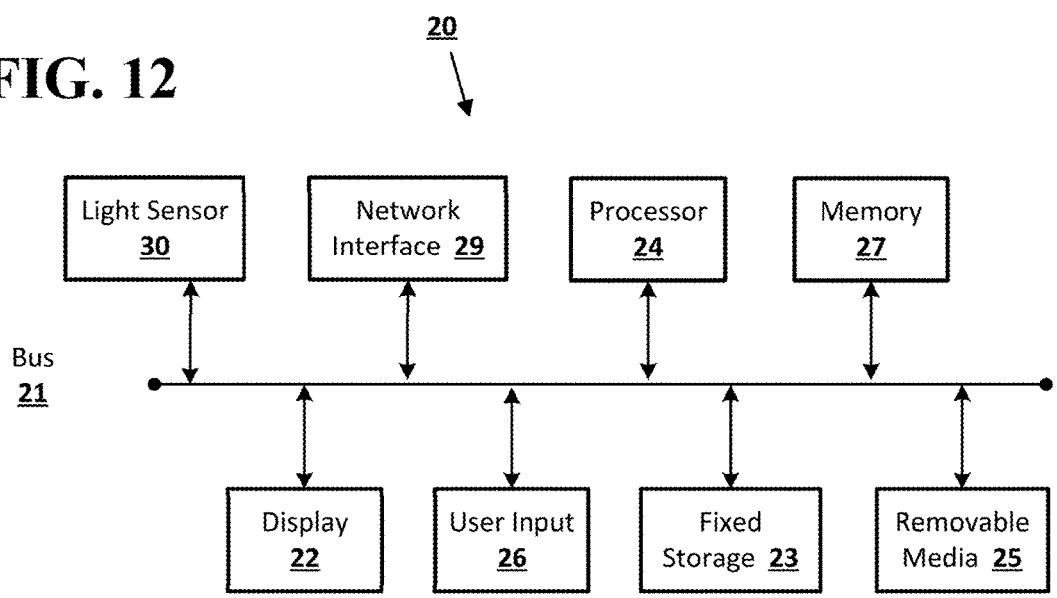
FIG. 12 shows a computing device according to an embodiment of the disclosed subject matter.

Embodiments of the presently disclosed subject matter may be implemented in and used with a variety of computing devices. FIG. 12 is an example computing device 20 suitable for implementing embodiments of the presently disclosed subject matter. For example, the device 20 may be used to implement a controller (e.g., controller 73 discussed above and shown in FIG. 10), a device including sensors as disclosed herein, or the like. Alternatively or in addition, the device 20 may be, for example, a desktop or laptop computer, or a mobile computing device such as a smart phone, tablet, or the like. The device 20 may include a bus 21 which interconnects major components of the computer 20, such as a central processor 24, a memory 27 such as Random Access Memory (RAM), Read Only Memory (ROM), flash RAM, or the like, a user display 22 such as a display screen, a user input interface 26, which may include one or more controllers and associated user input devices such as a keyboard, mouse, touch screen, and the like, a fixed storage 23 such as a hard drive, flash storage, and the like, a removable media component 25 operative to control and receive an optical disk, flash drive, and the like, a network interface 29 operable to communicate with one or more remote devices via a suitable network connection, and a light sensor 30 to receive light that may be modulated (e.g., IR light visible light, and/or ultraviolet light), which may be converted to an electrical signal and used to control one or more operations of the processor 24. Alternatively, the light sensor 30 may be replaced with a light emitter to emit light (e.g., IR light, visible light, and/or ultraviolet light) that may be modulated according to the processor 24. The modulated light emitted from light emitter may be received by the sensors 71, 72 shown in FIG. 10 having a light sensor to convert the light into electrical signals which may control one or more devices coupled to the smart-home network.

The bus 21 allows data communication between the central processor 24 and one or more memory components 25, 27, which may include RAM, ROM, and other memory, as previously noted. Applications resident with the computer 20 are generally stored on and accessed via a computer readable storage medium.

The fixed storage 23 may be integral with the computer 20 or may be separate and accessed through other interfaces. The network interface 29 may provide a direct connection to a remote server via a wired or wireless connection. The network interface 29 may provide such connection using any suitable technique and protocol as will be readily understood by one of skill in the art, including digital cellular telephone, Wi-Fi, Bluetooth®, near-field, and the like. For example, the network interface 29 may allow the device to communicate with other computers via one or more local, wide-area, or other communication networks, as described in further detail herein. The device 20 may also be able to communicate with other devices via the light emitter 30, which may output light that is modulated based on signals from the processor 24.

Various embodiments of the presently disclosed subject matter may include or be embodied in the form of computer-implemented processes and apparatuses for practicing those processes. Embodiments also may be embodied in the form of a computer program product having computer program code containing instructions embodied in non-transitory and/or tangible media, such as hard drives, USB (universal serial bus) drives, or any other machine readable storage medium, such that when the computer program code is loaded into and executed by a computer, the computer becomes an apparatus for practicing embodiments of the disclosed subject matter. When implemented on a general-purpose microprocessor, the computer program code may configure the microprocessor to become a special-purpose device, such as by creation of specific logic circuits as specified by the instructions.

Embodiments may be implemented using hardware that may include a processor, such as a general purpose microprocessor and/or an Application Specific Integrated Circuit (ASIC) that embodies all or part of the techniques according to embodiments of the disclosed subject matter in hardware and/or firmware. The processor may be coupled to memory, such as RAM, ROM, flash memory, a hard disk or any other device capable of storing electronic information. The memory may store instructions adapted to be executed by the processor to perform the techniques according to embodiments of the disclosed subject matter.

The foregoing description, for purpose of explanation, has been described with reference to specific embodiments. However, the illustrative discussions above are not intended to be exhaustive or to limit embodiments of the disclosed subject matter to the precise forms disclosed. Many modifications and variations are possible in view of the above teachings. The embodiments were chosen and described in order to explain the principles of embodiments of the disclosed subject matter and their practical applications, to thereby enable others skilled in the art to utilize those embodiments as well as various embodiments with various modifications as may be suited to the particular use contemplated.

The invention claimed is:

1. A system comprising:
   a sensor to receive light input and to output electrical signals proportional to the light input;
   an amplifier having an output terminal, a first input terminal connected to an output of the sensor, and a second input terminal to receive a bias voltage, the amplifier to amplify the electrical signals;
   a first resistor, a second resistor, and a third resistor configured in a T-network connected between the amplifier output terminal and the first input terminal; and
   a first capacitor in parallel with the first resistor, the second resistor, and the third resistor, and a second capacitor in series with the third resistor to filter the electrical signals in a predetermined frequency range so as to output filtered electrical signals.

2. The system of claim 1, further comprising:
   a fourth resistor in parallel with the sensor.

3. The system of claim 1, further comprising:
   a third capacitor coupled to the first input terminal of the amplifier.

4. The system of claim 1, wherein the sensor is selected from the group consisting of: a photodiode and a phototransistor.

5. The system of claim 1, wherein at least one of the first capacitor and the second capacitor increase the amplification by the amplifier for low frequency signals.

6. The system of claim 5, wherein at least one of the first capacitor and the second capacitor reject at least a portion of electrical disturbances.

7. The system of claim 5, wherein at least one of the first capacitor and the second capacitor reject at least a portion of electrical noise.

8. A method comprising:
   receiving, at a sensor, light input;
   outputting, at a sensor, electrical signals proportional to the light input;
   amplifying, at an amplifier, the electrical signals, wherein the amplifier has an output terminal, a first input terminal connected to an output of the sensor, and a second input terminal to receive a bias voltage; and
   filtering the electrical signals in a predetermined frequency range with a filter circuit that includes a first resistor, a second resistor, and a third resistor configured in a T-network connected between the amplifier output terminal and the first input terminal, wherein the filter circuit includes a first capacitor in parallel with the first resistor, the second resistor, and the third resistor, and a second capacitor in series with the third resistor; and
   outputting, at the filtering circuit, the output filtered electrical signals.

9. The method of claim 8, wherein the filtering the electrical signals comprises:
   filtering, at the filtering circuit, the electrical signals in a predetermined frequency range, wherein the filtering circuit includes a fourth resistor in parallel with the sensor.

10. The method of claim 8, wherein the filtering the electrical signals comprises: filtering, at the filtering circuit, the electrical signals in a predetermined frequency range, wherein the filtering circuit includes a third capacitor coupled to the first input terminal of the amplifier.

11. The method of claim 8, wherein the light input is received by the sensor, which is selected from the group consisting of: a photodiode and a phototransistor.

12. The method of claim 8, wherein at least one of the first capacitor and the second capacitor increase the amplification by the amplifier for low frequency signals.

13. The method of claim 12, wherein at least one of the first capacitor and the second capacitor reject at least a portion of electrical disturbances.

14. The method of claim 12, wherein at least one of the first capacitor and the second capacitor reject at least a portion of electrical noise.

* * * * *